United States Patent [15] 3,649,843
Redwine et al. [45] Mar. 14, 1972

[54] MOS BIPOLAR PUSH-PULL OUTPUT BUFFER

[72] Inventors: Donald J. Redwine; Earl M. Worstell, Jr., both of Houston, Tex.

[73] Assignee: Texas Instruments Incorporated, Dallas, Tex.

[22] Filed: June 26, 1969

[21] Appl. No.: 836,796

[52] U.S. Cl. ..............................307/214, 307/205, 307/303, 307/304, 317/235 B, 317/235 G, 330/35
[51] Int. Cl. ..............................H03k 19/40
[58] Field of Search ..............330/15, 35; 307/205, 213, 214, 307/303, 304; 317/235

[56] References Cited

UNITED STATES PATENTS 3,466,511 9/1969 Lin....................................307/303 X
3,506,851 4/1970 Polkinghorn et al...............307/304 X

OTHER PUBLICATIONS

Ahrons et al., " Hybrid Bi-Polar and Mos Digital Circuits" RCA Technical Notes, RCA TN No. 684, June 1966

*Primary Examiner*—Roy Lake
*Assistant Examiner*—James B. Mullins
*Attorney*—James O. Dixon, Andrew M. Hassell, Harold Levine, Melvin Sharp, John E. Vandigriff, Henry T. Olsen and Michael A. Sileo, Jr.

[57] ABSTRACT

An output buffer for an MOS integrated logic circuit which utilizes an output stage comprised of a bipolar transistor and an MOS transistor connected in push-pull configuration is described. The output stage is operated by an MOS control circuit which utilizes an inverter stage with an improved capacitive bootstrap switching network to reduce the magnitude of the gate supply voltage required for positive switching. The circuit is characterized by very low input capacitance, and very low output impedance and thus high capacitive drive capability. A unique connection to ground internally of the integrated circuit is also described which comprises a diffusion made at the same time as the emitter diffusion of the bipolar transistor to provide ohmic contact between an overlying conductor and the substrate which then provides the return path to ground.

12 Claims, 4 Drawing Figures

INVENTORS
DONALD J. REDWINE
EARL M. WORSTELL, JR.

INVENTORS
DONALD J. REDWINE
EARL M. WORSTELL, JR.

MOS BIPOLAR PUSH-PULL OUTPUT BUFFER

This invention relates generally to metal-insulator-semiconductor integrated circuits, and more particularly relates to an improved push-pull output buffer for an integrated logic circuit.

The metal-insulator-semiconductor (MOS) transistor wherein the insulator is silicon oxide is currently the most practical form and therefore the most widely used type of field effect transistor. The MOS transistor is typically a high voltage, low current device. These characteristics are due mainly to the values of hole and electron mobilities at the surface of the semiconductor. These characteristics require that the MOS transistors drive high impedance loads in order to develop the voltage levels required in a circuit. These devices have many useful applications in integrated circuit form, commonly referred to as MOSIC's. In the typical situation, one MOSIC will drive one or more other MOSIC's. Thus, the output load, for all practical purposes, is capacitive. In general, the problem of getting the logic signal from one MOSIC to another MOSIC has been the most difficult to overcome in the design of such devices. Internally an MOSIC may be very complex and fast, but this characteristic has heretofore been practically useless because the speed of the circuit was limited by the output buffers.

The output impedance, and therefore the transient time performance, of an all MOS output buffer is controlled by adjusting the width-to-length ratio of the MOS transistors. Conventional output buffers use very large MOS transistors to drive even minimal external capacitances, such as 20 picofarads, at relatively slow speeds, such as one MHz. The large output MOS transistors must themselves be driven by large MOS transistors, such that each of the last few stages of a circuit must have progressively larger drive capability. This results in what is commonly referred to as a tapered output. The larger MOS transistors have increased power dissipation, and occupy a large area of the integrated circuit chip.

The all MOS push-pull output buffer is perhaps the best output buffer previously in use. In this buffer, two MOS transistors are connected in push-pull configuration in the output stage. The MOS transistors must be very large to drive even a small capacitive load. This results in a high input capacitance, typically on the order of 1.6 picofarads, which requires tapering, and the output impedance is still undesirably high. In addition, the conventional all MOS push-pull buffers require high gate voltage on the order of −20.0 volts and occupy a considerable area of the integrated circuit chip.

MOSIC's are typically fabricated on an N-type substrate by making a set of P-type diffusions to form source and drain regions for the MOS transistors, one plate of any capacitors, resistors, or second level interconnections. The insulating layer, typically silicon oxide although other insulators such as silicon nitride may be used, is made thin where MOS transistor channels are to be formed and opened where contact with the diffused regions is required. Metal conductors are then placed on the insulating layer to form the gates of the MOS transistors, other plates of the capacitors, and leads interconnecting the circuit. Although the metal conductors and diffused regions form a two-level system of interconnections, considerable surface area is occupied on an integrated circuit by the various conductors which must extend to a major portion of the logic function blocks on the circuit, such as drain supply voltage, gate supply voltage, clock voltage, and the source supply voltage, which is typically ground. The ground line is required because even though the substrate is usually grounded, the source diffusions form a PN junction with the substrate.

This invention is concerned with an improved output buffer which has a very low input capacitance, a very low output impedance, and a switching speed greater than that obtainable within the integrated circuit so that the speed of the MOSIC is no longer limited by the speed of the output buffer. The output buffer in accordance with this invention has no DC path to ground, and therefore has low power requirements. The low output impedance provides a high charge and discharge capability for capacitive loads. The low input capacitance eliminates the need for tapering, which decreases the area required for the buffer. The circuit employs an improved bootstrap network which reduces the gate supply voltage $V_{gg}$ required to maintain the output level at a logic "1" level under steady state conditions. The buffer is sufficiently fast that no appreciable signal delay results. The MOSIC also utilizes an ohmic connection to the substrate which eliminates the need for a ground conductor that extends throughout the circuit.

The output buffer is comprised of an MOS transistor and a bipolar transistor formed on the same semiconductor chip and connected in push-pull configuration. An inverter stage to the buffer controls the MOS transistor and clamps the bipolar transistor "off" when the MOS transistor is "on" to produce a logic "1" output in response to a logic "0" input. The inverter stage utilizes capacitive pull up for switching, and a high resistance current path to maintain the output MOS full "on" under steady state conditions while using a lower gate supply voltage. The bipolar transistor is turned "on" in response to a logic "1" input applied to the gate of an MOS transistor which connects the base of the bipolar transistor to ground.

This invention also contemplates using a diffused region of the same conductivity type as the substrate to provide an ohmic contact between a metal conductor and the substrate so that the substrate can be used as the ground return and thus eliminate the need for a ground conductor extending over the chip. This diffused region can be made by the same diffusion step used to form the emitter of the bipolar transistor.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figure 1:
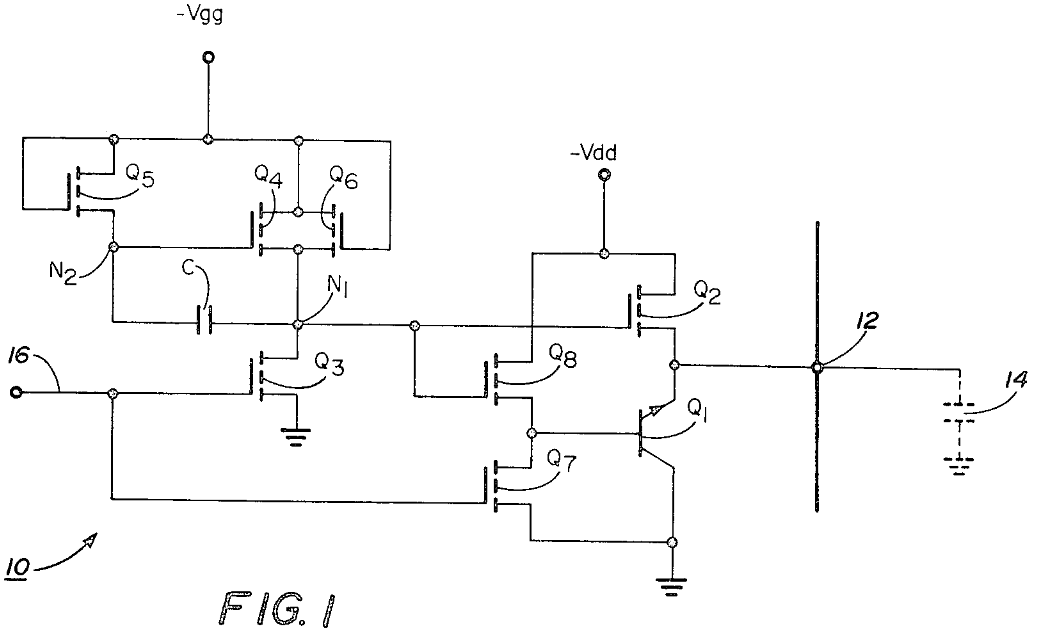
FIG. 1 is a schematic circuit diagram of an output buffer in accordance with the present invention.

Referring now to FIG. 1, an output buffer in accordance with the present invention is indicated generally by the reference numeral 10. The buffer 10 selected as the illustrative embodiment of the invention utilizes P-channel MOS transistors and an NPN bipolar transistor. The invention is equally applicable to N-channel MOS transistors and a PNP bipolar transistor. The buffer 10 has an output stage comprised of a bipolar transistor $Q_1$ and an MOS output transistor $Q_2$. The emitter of the bipolar transistor $Q_1$ and the source of the MOS transistor $Q_2$ are common and form the logic output 12, which is illustrated as being connected to drive an external capacitive load represented at 14.

Transistor $Q_2$ is controlled by an input inverter stage comprised of MOS transistors $Q_3$, $Q_4$, $Q_5$ and $Q_6$ and capacitor C. The channels of transistors $Q_3$ and $Q_4$ are connected in series between the source supply voltage, represented by the ground symbol, and the gate supply voltage $-V_{gg}$. The gate of MOS transistor $Q_3$ is connected to the logic input 16. The channel of MOS transistor $Q_5$ connects the gate of MOS transistor $Q_4$ to the gate supply voltage $V_{gg}$. The gate of MOS transistor $Q_5$ is connected to the gate supply voltage $V_{gg}$. The gate of MOS transistor $Q_4$ is coupled to the source of MOS transistor $Q_4$ by a capacitor C. Node $N_2$, which is formed by the gate of transistor $Q_4$, the source of transistor $Q_5$, and one side of the capacitor C is coupled by capacitor C to the output node $N_1$ of the input inverter stage. Output node $N_1$ is connected to the gate of output MOS transistor $Q_2$. The channel of transistor $Q_6$ is connected parallel to the channel of transistor $Q_4$, and the gate of transistor $Q_6$ is connected to the gate voltage $-V_{gg}$.

The width-to-length ratio of transistor $Q_3$ is much greater than the width-to-length ratio of MOS transistor $Q_4$, which in turn is much greater than the width-to-length ratio of transistor $Q_6$. For example, the width-to-length ratio of the channel of transistor $Q_3$ may be five times as great as that of transistor $Q_4$, and one hundred times as great as that of transistor $Q_6$. As a result, the voltage level of output node $N_1$ is controlled by the state of transistor $Q_3$. The width-to-length ratio of transistor $Q_5$ may be about the same as that of transistor $Q_4$.

The base of bipolar transistor $Q_1$ is connected to the collector of the transistor by the channel of an MOS transistor $Q_7$, and to the drain voltage $-V_{dd}$ by the channel of MOS transistor $Q_8$. The gate of MOS transistor $Q_7$ is also connected to the logic input 16 of the circuit. The gate of MOS transistor $Q_8$ is connected to the output node $N_1$ of the inverter stage. The width-to-length ratios of transistors $Q_7$ and $Q_8$ are typically equal and of moderate size. The width-to-length ratio of the output MOS transistor $Q_2$ may be large in relationship to the other transistors in the circuit, and is typically about five times that of input MOS transistor $Q_3$.

In order to understand the operation of the buffer 10, assume that 1logic "1" level is a negative voltage approaching the drain voltage $-V_{dd}$, typically approximately −6.0 volts, and that the logic "0" level is a voltage very near ground, typically −1.0 volt. Then if the logic input 16 is initially at a logic "1" level of −6.0 volts, the P-channel MOS transistor $Q_3$ will be turned "on" so that the output node $N_1$ of the inverter is at approximately −1.0 volt, which turns output MOS transistor $Q_2$ "off." Transistor $Q_7$ would also be turned "on" by the logic "0" input, MOS transistor $Q_8$ would be turned "off" by the logic "0" at node $N_1$, and bipolar transistor $Q_1$ would therefore be turned "on." The output 12 would then be at approximately −1.0 volt, with transistor $Q_1$ discharging the capacitive load 14. Thus, it will be noted that the logic "1" signal at input 16 is inverted to a logic "0" level at output 12. It should also be noted that with transistors $Q_2$ and $Q_8$ turned "off", there is no DC path from the drain voltage supply $-V_{dd}$ to ground in the output stage, thus preventing any unnecessary power dissipation.

It should also be noted that when transistor $Q_3$ is turned "on" as a result of the logic "1" level at input 16, capacitor C is charged through MOS transistor $Q_5$ to a voltage level equal to the gate supply voltage $-V_{gg}$ less the threshold voltage of transistor $Q_5$. Since the gate supply voltage $-V_{gg}$ is typically −14.0 volts, the capacitor C is typically charged to about −12.0 volts with respect to node $N_1$, which is normally at about −1.0 volt. When the logic input 16 changes from a logic "1" level to a logic "0" level, node $N_1$ starts to go more negative as transistor $Q_3$ switches "off." The charge on capacitor C causes node $N_2$ to follow node $N_1$ and also go more negative, which instantly switches MOS transistor $Q_5$ "off." This allows node $N_2$ to follow node $N_1$ at a level more negative than node $N_1$ by approximately −12.0 volts, which is the voltage across capacitor C, and ultimately exceed even the gate supply voltage $-V_{gg}$. This maintains the gate of transistor $Q_4$ sufficiently negative to allow node $N_1$ to charge all the way to the gate supply voltage $-V_{gg}$, thus turning output MOS transistor $Q_2$ "on." As node $N_1$ goes negative, transistor $Q_8$ is also switched "on," thus causing the base of transistor $Q_1$ to be at approximately the same potential as the emitter. Since transistor $Q_7$ was switched "off" as the logic input 16 went to a logic "0" level, transistor $Q_1$ is clamped "off." The combination of bipolar transistor $Q_1$ being turned "off," and MOS transistor $Q_2$ being turned "on," charges the capacitive load 14 to the logic "1" level of approximately −6.0 volts.

As the charge on node $N_2$ leaks off, node $N_1$ becomes more positive, and without MOS transistor $Q_6$ being in the circuit, would ultimately reach a level equal to $-V_{gg} + 2V_T$, where $V_T$ is the threshold drop of the MOS transistors $Q_4$ and $Q_5$. Since the leakage time is typically about one minute, the input 16 will revert to a logic "1" level before the charge on node $N_2$ leaks off to a level such as to adversely affect the output voltage level. However, for reliable operation it is necessary to have the gate voltage $-V_{gg}$ at a sufficiently negative level to insure that node $N_1$ would always be sufficiently negative to maintain output MOS transistor $Q_2$ full "on." The very small MOS transistor $Q_6$ prevents the node $N_1$ from becoming more positive than $-V_{gg} + V_T$ during the period when a logic "0" level is applied to input 16, thus permitting a lower gate voltage $-V_{gg}$ to be used for the circuit.

Figure 2:
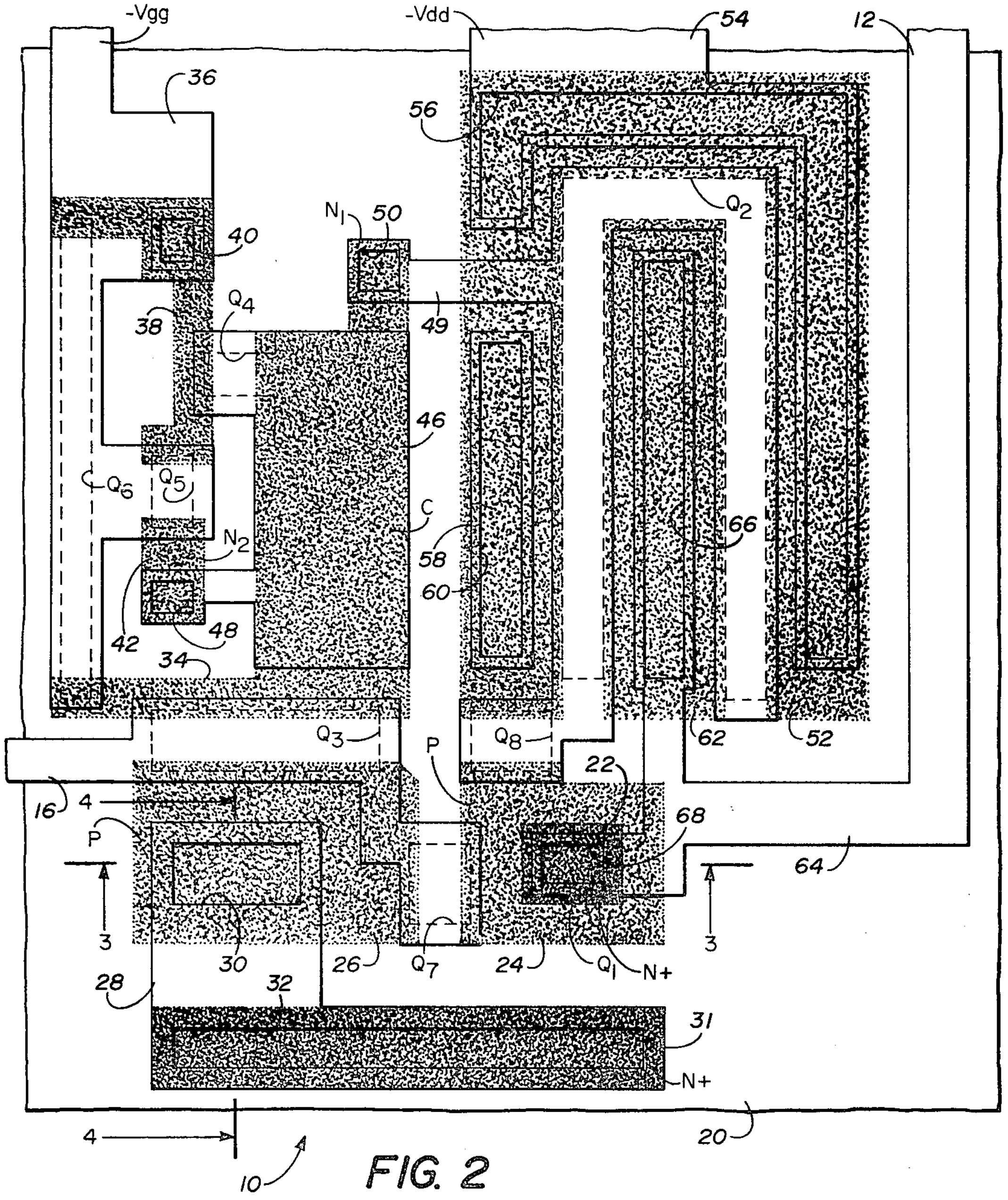
FIG. 2 is an enlarged, somewhat schematic plan view of the output buffer of FIG. 1 illustrated as part of an integrated circuit.

The output buffer 10 of FIG. 1 is also illustrated in the plan view of FIG. 2 wherein corresponding components are designated by corresponding reference characters. The buffer 10 is a part of an integrated circuit formed on an N-type silicon substrate 20. P-type diffused regions are indicated by the lightly stippled areas and form the source and drain regions of the various MOS transistors as will presently be described. N-type diffused regions are represented by the more heavily stippled areas. Metallized conductors are formed over an oxide layer in the conventional manner and are indicated in solid outline. The dotted outlines indicate the areas in which the oxide is made thin under the metal conductors so as to form active MOS transistors. The areas where the metal conductors extend through openings in the oxide layer into contact with the underlying diffused regions are shown by the recesses in the metal conductors.

Thus, the logic input 16 is a metal conductor leading to and forming the gates for transistors $Q_3$ and $Q_7$ in the areas bounded by the dotted outlines. The P-type diffused region 26 forms the source regions for transistors $Q_3$ and $Q_7$. The collector of the bipolar transistor $Q_1$ is the substrate 20. P-type diffused region 24 forms the base and N+ diffused region 22 the emitter of the bipolar transistor.

Figure 4:
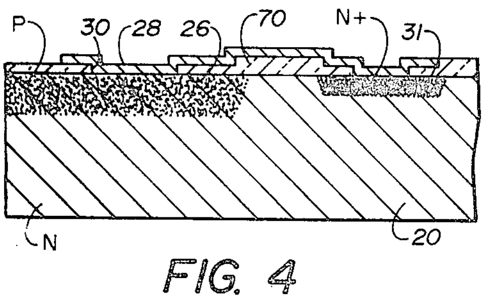
FIG. 4 is a sectional view taken substantially on lines 4—4 of FIG. 2.

In accordance with one aspect of this invention, the source region 26 is connected to ground by conductor 28 which extends through opening 30 in the oxide and through opening 32 in the oxide into contact with N+ diffused region 31, as can best be seen in FIG. 4. The N+ diffused region 31 provides ohmic contact with the substrate which is the collector of the bipolar transistor $Q_1$, and which is also grounded.

P-type region 24 also forms the drain of MOS transistor $Q_7$. Diffused region 34 forms the drain of MOS transistor $Q_3$, the source of MOS transistor $Q_6$, and one plate of the capacitor C. Metal conductor 36 is connected to the gate supply voltage $-V_{gg}$ and forms the gates of MOS transistor $Q_6$ and MOS transistor $Q_5$. Diffused region 38 forms the drain regions for MOS transistors $Q_6$, $Q_5$ and $Q_4$, and is connected to conductor 36 through opening 40 in the oxide layer. Diffused region 42 forms the source of transistors $Q_5$ and node $N_2$. Metal conductor 46 is connected to diffused region 42 through opening 48 and forms the other plate of capacitor C and the gate of transistor $Q_4$. Metal conductor 49 is connected to diffused region 34 through opening 50 in the oxide and forms the gate of the output MOS transistor $Q_2$ and the gate of MOS transistor $Q_8$. U-shaped diffused region 52 forms the drain of MOS output transistor $Q_2$ and MOS transistor $Q_8$, and conductor 54 is connected to the drain supply voltage $-V_{dd}$ and to the diffused region 52 through opening 56. Metal conductor 58 is in contact with diffused region 52 through opening 60 to reduce the internal resistance of diffused region 52. Diffused region 62 forms the source of output MOS transistor $Q_2$. Conductor 64 forms the logic output 12 and is in contact with diffused region 62 through opening 66 in the oxide, and with the emitter region 22 of bipolar transistor $Q_1$ through opening 68.

Figure 3:
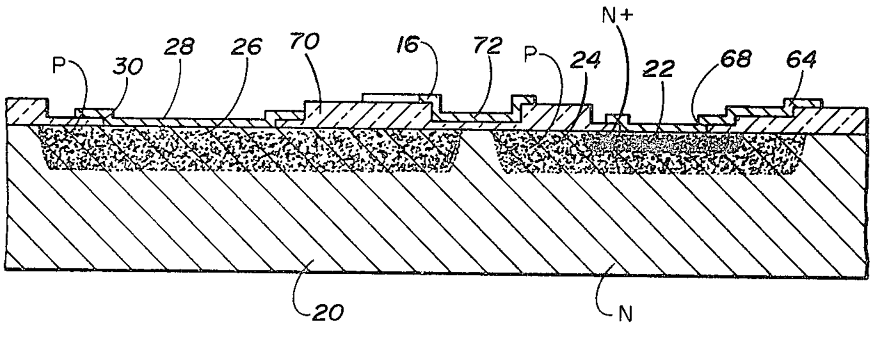
FIG. 3 is a sectional view taken substantially on lines 3–3 of FIG. 2.

FIG. 3 is a sectional view taken substantially on lines 3—3 of FIG. 2 and corresponding components are designated by the same reference characters. From FIG. 3 it can be seen how the oxide layer 70 is made thin in region 72 to form the active MOS transistor $Q_7$, and how the openings 30 and 68 are made in the oxide to permit contact between conductor 28 and diffused region 26, and conductor 64 and diffused region 22, respectively.

In summary, the buffer 10 has a low input capacitance because of the low input capacitance of MOS transistors $Q_3$ and $Q_7$, yet also has a low output impedance because of the gain of bipolar transistor $Q_1$ and the size of output MOS transistor $Q_2$. The low output impedance provides a high drive and discharge capability, and the attendant high switching speed when coupled to a capacitive load. The push-pull configuration of the output stage results in no DC path to ground since either bipolar transistor $Q_1$ or MOS transistor $Q_2$ is always turned "off," as is one of the MOS transistors $Q_7$ or $Q_8$. The capacitive pull up or bootstrap network needs a relatively low power for operation. The use of transistor $Q_6$ reduces the negative voltage level required for reliable operation. There is no appreciable signal delay through the output buffer, thus posing no limitation upon the speed of operation of the overall MOSIC.

Although the embodiment of the invention described utilizes P-channel metal-oxide-semiconductor transistors and an NPN bipolar transistor, it is to be understood that N-channel MOS transistors and a PNP bipolar transistor could also be used. Additionally, it is to be understood that the term MOS transistor is intended to mean any of the metal-insulator-semiconductor or other similar field effect devices.

Although a preferred embodiment of the invention has been described in detail, it is to be understood that various changes, substitutions and alterations can be made therein without departing from the spirit and scope of the invention as defined by the appended claims.

What is claimed is:

1. An output buffer for an integrated semiconductor logic circuit comprising a field effect output transistor and a bipolar output transistor connected in push-pull configuration to form an output stage, and control means for turning the field effect transistor "on" and turning the bipolar transistor "off" in response to one condition of a logic input signal, and for turning the field effect transistor "off" and the bipolar transistor "on" in response to another condition of the logic input signal, and wherein the output of said buffer is taken from the emitter of said bipolar transistor.

2. The circuit of claim 1 wherein the control means comprises second, third, fourth and fifth MOS transistors, the channel of the second MOS transistor connecting the base of the bipolar transistor to the collector and the gate being connected to the logic input, the gate of the third field effect transistor being connected to the logic input, the channels of the third and fourth transistors being connected in series between the source supply voltage and the gate supply voltage with the common source-drain point being connected to the gate of the output transistor, the channel of the fifth MOS transistor interconnecting the gate of the fourth MOS transistor and the gate supply voltage, the gate of the fifth MOS transistor being connected to the gate supply voltage, and a capacitor coupling the gate of the fourth MOS transistor to the common source-drain point of the third and fourth MOS transistors, the saturation impedance of the third MOS transistor being substantially less than that of the fourth MOS transistor.

3. The circuit of claim 2 further characterized by a sixth MOS transistor the channel of which is connected in parallel with the channel of the fourth MOS transistor, the saturation impedance of the sixth MOS transistor being substantially greater than that of the fourth MOS transistor.

4. The circuit of claim 3 further characterized by a seventh MOS transistor connecting the gate of the bipolar transistor to the drain supply voltage of the output transistor, the gate of the seventh MOS transistor being connected to the common source-drain of the third and fourth transistors.

5. The control circuit for switching a first MOS transistor "on" and "off" in response to a logic control signal comprising second, third, fourth and fifth MOS transistors, the channels of the second and third MOS transistors being connected in series between a source supply voltage and a gate supply voltage with the common drain-source point being connected to the gate of the first MOS transistor, the gate of the third MOS transistor being connected by the channel of the fourth MOS transistor to the gate supply voltage, the gate of the fourth MOS transistor being connected to the gate supply voltage, the channel of the fifth MOS transistor being connected in parallel with the channel of the third MOS transistor, the gate of the fifth MOS transistor being connected to the gate supply voltage, and a capacitor coupling the gate of the third MOS transistor to the common drain-source of the second and third MOS transistors.

6. An output buffer for an integrated semiconductor logic circuit comprising a field effect output transistor and a bipolar output transistor connected in push-pull configuration to form an output stage, and control means for turning the field effect transistor "on" and turning the bipolar transistor "off" in response to one condition of a logic input signal, and for turning the field effect transistor "off" and the bipolar transistor "on" in response to another condition of the logic input signal, and wherein the control means comprises an MOS inverter stage for receiving the logic signal, the output of which is connected to the gate of the output transistor, and a third field effect transistor connecting the base of the bipolar output transistor to the collector, the gate of the third transistor being connected to receive the logic signal.

7. In an integrated semiconductor circuit, the combination comprising a substrate of one conductivity type, a source region and a drain region of the other conductivity type, means coupling the source region to the drain region to form a first field effect transistor, a base region of said other conductivity type having disposed therein an emitter region of said one conductivity type to form a bipolar transistor, means coupling the emitter region to the source region to form an emitter-source junction, and wherein the emitter-source junction is the output of the circuit.

8. The combination of claim 7 further including means coupling the drain region to a first potential and means coupling the collector region to a second potential different from the first potential for providing operating potentials for said semiconductor circuit.

9. The combination of claim 7 further characterized by means forming a control circuit for turning the field effect channel "on" and the bipolar transistor "off" in response to one condition of a logic input signal, and for turning the field effect channel "off" and the bipolar transistor "on" in response to another condition of the logic input signal.

10. The combination of claim 8 wherein the control circuit includes at least one diffusion of the one conductivity type directly contacting the substrate and a metal conductor in contact with said last mentioned at least one diffusion.

11. The circuit of claim 9 wherein the control means comprises an MOS inverter stage for receiving the logic signal the output of which is connected to the gate of the output transistor, and a third field effect transistor connecting the base of the bipolar output transistor to the collector, the gate of the third transistor being connected to receive the logic signal.

12. The combination of claim 9 wherein the control circuit comprises second, third, fourth and fifth MOS transistors, the channels of the second and third MOS transistors being connected in series between a source supply voltage and a gate supply voltage with the common drain-source point being connected to the gate of the first MOS transistor, the gate of the third MOS transistor being connected by the channel of the fourth MOS transistor to the gate supply voltage, the gate of the fourth MOS transistor being connected to the gate supply voltage, the channel of the fifth MOS transistor being connected in parallel with the channel of the third MOS transistor, the gate of the fifth MOS transistor being connected to the gate supply voltage, and a capacitor coupling the gate of the third MOS transistor to the common drain-source of the second and third MOS transistors.

* * * * *